United States Patent

Choi

[11] Patent Number: 5,995,089
[45] Date of Patent: *Nov. 30, 1999

[54] DEVICE FOR PROTECTING A VERTICAL DEFLECTION INTEGRATED CIRCUIT FOR A MONITOR

[75] Inventor: Yong Seok Choi, Kumi, Rep. of Korea

[73] Assignee: LG Electronics, Inc., Seoul, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 08/613,062

[22] Filed: Mar. 8, 1996

[30] Foreign Application Priority Data

Mar. 11, 1995 [KR] Rep. of Korea ................. 95-04252 U

[51] Int. Cl.[6] ................................................ G09G 5/00
[52] U.S. Cl. .......................................... 345/213; 345/13
[58] Field of Search ............................. 345/10, 11, 13, 345/14, 213; 348/806, 807, 745, 746, 747; 315/364, 379; H04N 3/22, 3/23, 3/26

[56] References Cited

U.S. PATENT DOCUMENTS 3,772,563  11/1973  Hasenbalg ........................ 315/379
3,974,420  8/1976  Izura et al. ........................ 345/13
5,394,171  2/1995  Rabii ................................ 345/213

FOREIGN PATENT DOCUMENTS 1500608  2/1978  United Kingdom.

Primary Examiner—Chanh Nguyen
Attorney, Agent, or Firm—Oppenheimer Wolff & Donnelly LLP

[57] ABSTRACT

A vertical deflection IC protection device for a monitor employing a dedicated display data channel (DDC) chip which can prevent the vertical deflection IC from being damaged by intercepting an input of a high frequency of about 25 KHz to the vertical deflection IC when monitor information data stored in the DDC chip is read out by a computer. The protection device includes a DDC section receiving a vertical sync signal from a computer I/O section and outputting DDC data to the computer I/O section when a predetermined time elapses thereafter, and a vertical frequency selection control section which intercepts the input of an abnormal vertical sync signal, which has a frequency higher than the normal vertical sync signal, to the vertical deflection IC when the abnormal vertical sync signal is inputted from the computer I/O section for the DDC data transmission.

5 Claims, 3 Drawing Sheets

FIG. 1 (PRIOR ART)
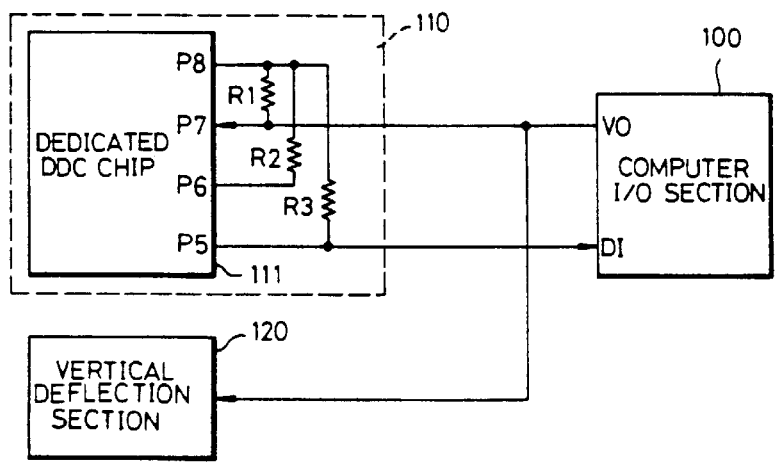
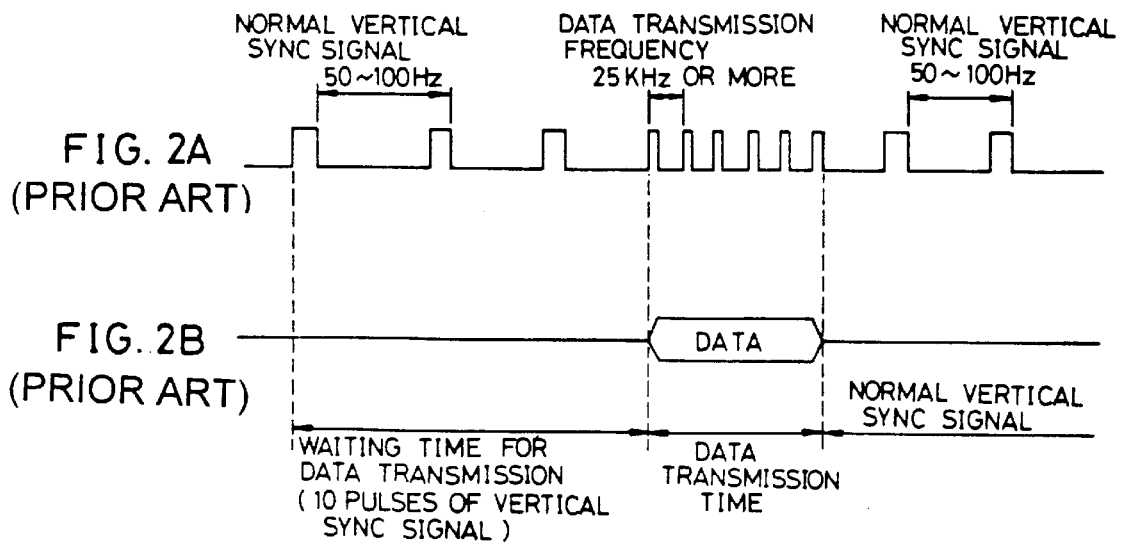
FIG. 2A
(PRIOR ART)
FIG. 2B
(PRIOR ART)

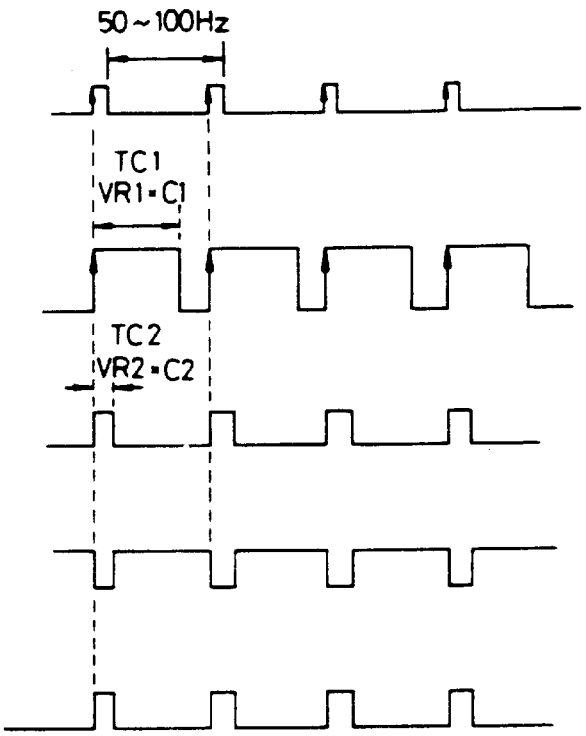
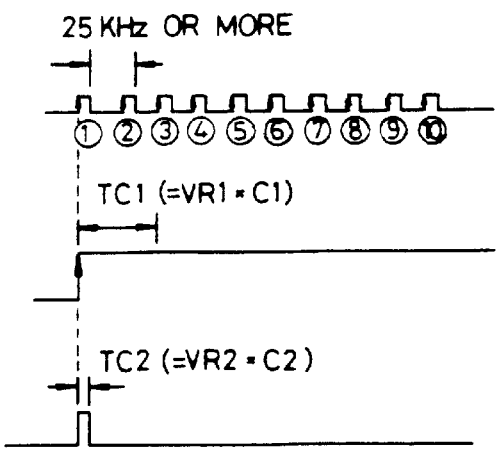

DEVICE FOR PROTECTING A VERTICAL DEFLECTION INTEGRATED CIRCUIT FOR A MONITOR

BACKGROUND OF THE INVENTION

1. Field of the Invention

The present invention relates generally to the protection of a vertical deflection integrated circuit (IC) for a monitor, and in particular to a device for protecting a vertical deflection IC for a monitor employing a dedicated display data channel (DDC) chip which can prevent the vertical deflection IC from getting damage due to an instantaneous supply of a vertical sync signal of 25 KHz or more to a vertical deflection circuit of the monitor when data stored in the dedicated DDC chip is read out by a computer.

2. Description of the Prior Art

Generally, a monitor may employ a dedicated DDC chip in which information on the specification, manufacturing date, serial number, etc. of the monitor has been stored by a manufacturer. If necessary, such DDC information can be displayed on the screen of the monitor by a user.

FIG. 1 is a block diagram of a conventional device for a monitor employing a dedicated DDC chip. Referring to FIG. 1, the conventional device is provided with a computer input/output (I/O) section 100 which outputs a vertical sync signal provided from a computer to a DDC section 110 and a vertical deflection section 120 when power is supplied, and then receives monitor information data from the DDC section 110 when a predetermined time elapses thereafter; a DDC section 110 which receives the vertical sync signal outputted from the computer I/O section 100, and then outputs the monitor information data stored therein to the computer I/O section 100 when the predetermined time elapses thereafter; and a vertical deflection section 120 which receives the vertical sync signal outputted from the computer I/O section 100 and performs vertical deflection in accordance with the input vertical sync signal.

The operation of the conventional device for a monitor employing the DDC chip will be described in detail.

When the power is supplied to the monitor, the computer I/O section 100 outputs a vertical sync signal of about 50–100 Hz as shown in FIG. 2A through its output terminal VO to the seventh pin P7 of the dedicated DDC chip 111 in the DDC section 110 and to the vertical deflection section 120.

The period during which ten pulses of the vertical sync signal are outputted corresponds to a waiting time for data transmission as shown in FIG. 2B. When this waiting time elapses, the DDC section 110 outputs the monitor information data stored in the dedicated DDC chip 111 through its fifth pin P5 to the data input terminal DI of the computer I/O section 100.

At this time, the monitor information data is transmitted with a data transmission frequency of about 25 KHz or more in order to shorten the data transmission time. In other words, the vertical sync signal of about 25 KHz or more is outputted from the output terminal VO of the computer I/O section 110 to the vertical deflection section 120, and thus the vertical deflection IC (not illustrated) in the vertical deflection section 120 performs vertical deflection in accordance with the vertical sync signal. As a result, the information stored in the dedicated DDC chip 111 in the DDC section 110 is displayed on the screen of the monitor.

After the data transmission as described above is completed, the computer I/O section 100 outputs the normal vertical sync signal of about 50–100 Hz through its output terminal VO to the seventh pin P7 of the dedicated DDC chip 111 in the DDC section 110 and to the vertical deflection section 120, resulting in that a normal image is displayed on the monitor screen.

In the conventional device for a monitor employing a dedicated DDC chip, however, the vertical deflection IC in the vertical deflection section 120 is designed to operate with a vertical sync signal of about 50–100 Hz, and thus it is liable to be damaged in the event that the vertical sync signal of about 25 KHz is inputted thereto for the transmission of the DDC data, thereby deteriorating the reliability of the monitor.

SUMMARY OF THE INVENTION

The present invention has been made to solve the problems involved in the prior art. It is an object of the present invention to provide a device for protecting a vertical deflection IC for a monitor employing a dedicated DDC chip. The device can prevent the vertical deflection IC from damage by intercepting the input of the vertical sync signal of about 25 KHz for use in data transmission to the vertical deflection circuit in the monitor when data stored in the dedicated DDC chip is read out by a computer.

In other to achieve the above object, there is provided a device for protecting a vertical deflection IC for a monitor connected to a computer and having DDC means and vertical deflection means including a vertical deflection IC, the device comprising:

computer I/O means providing a vertical sync signal to said DDC means and said vertical deflection means when power is supplied, and receiving monitor information data from said DDC means when a predetermined time elapses thereafter;

said DDC means receiving said vertical sync signal provided from said computer I/O means, and providing said monitor information data to said computer I/O means when said predetermined time elapses thereafter; and vertical frequency selection control means providing said vertical sync signal to said vertical deflection means if said vertical sync signal is received from said computer I/O means, and intercepting an input of an abnormal vertical sync signal to said vertical deflection means having a frequency higher than that of said vertical sync signal if said abnormal vertical sync signal is received from said computer I/O means.

BRIEF DESCRIPTION OF THE DRAWINGS

The above object and other features of the present invention will become more apparent by describing the preferred embodiment thereof with reference to the accompanying drawings, in which:

FIG. 1 is a block diagram of a conventional device for a monitor employing a dedicated DDC chip.

FIGS. 2A and 2B are waveform diagrams explaining the operation of the device of FIG. 1.

FIGS. 5A to 5E are waveform diagrams explaining the operation of the vertical frequency selection control section in FIG. 4 when a normal vertical sync signal is inputted.

FIGS. 6A to 6E are waveform diagrams explaining the operation of the vertical frequency selection control section in FIG. 4 when an abnormal vertical sync signal having a frequency higher than that of the normal vertical sync signal is inputted.

DETAILED DESCRIPTION OF THE PREFERRED EMBODIMENT

Figure 3:
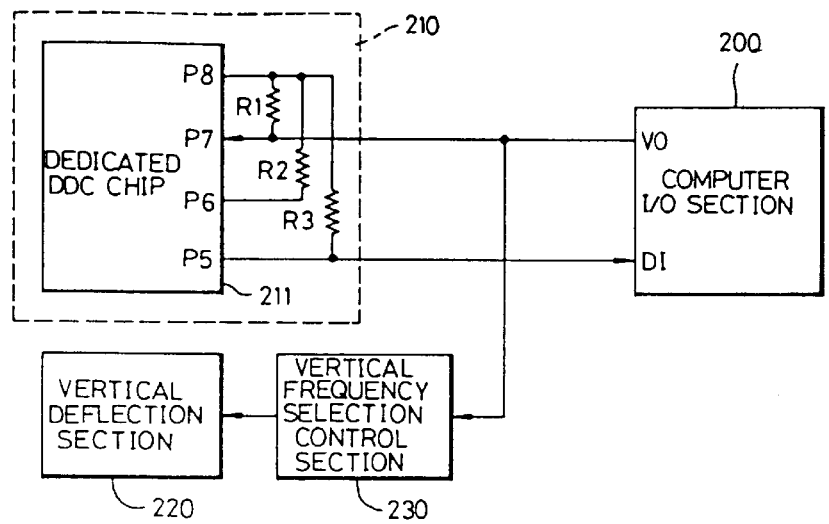
FIG. 3 is a block diagram of the protection device according to the present invention.

FIG. 3 is a block diagram of the protection device according to the present invention. Referring to FIG. 3, the protection device according to the present invention is provided with a computer I/O section 200 which outputs a vertical sync signal provided from a computer to a DDC section 210 and a vertical deflection section 220 when power is supplied, and receives monitor information data from the DDC section 210 when a predetermined time elapses thereafter; a DDC section 210 which receives the vertical sync signal outputted from the computer I/O section 200, and outputs the monitor information data to the computer I/O section 200 when the predetermined time elapses thereafter; a vertical frequency selection control section 230 which outputs the vertical sync signal to the vertical deflection section 220 if the vertical sync signal is received from the computer I/O section 200, and which intercepts an input of an abnormal vertical sync signal to the vertical deflection section 220 having a frequency higher than that of the vertical sync signal if the abnormal vertical sync signal is received from the computer I/O section 200; a vertical deflection section 220 which performs vertical deflection in accordance with the vertical sync signal provided from the vertical frequency selection control section 230.

Meanwhile, the vertical frequency selection control section 230 comprises a first monostable multivibrator section 231 which receives the vertical sync signal and outputs a first pulse signal having a first width determined by a first time constant, a second monostable multivibrator section 232 which receives the first pulse signal outputted from the first monostable multivibrator section 231 and outputs a second pulse signal having a second pulse width determined by a second time constant, and a switching section 233 which is switch-controlled in accordance with the second pulse signal outputted from the second monostable multivibrator section 232 and transfers the second pulse signal to the vertical deflection section 220.

The operation of the vertical deflection IC protection device according to the present invention as constructed above will now be explained with reference to FIGS. 3, 4, 5A to 5E, and 6A to 6E.

Figure 4:
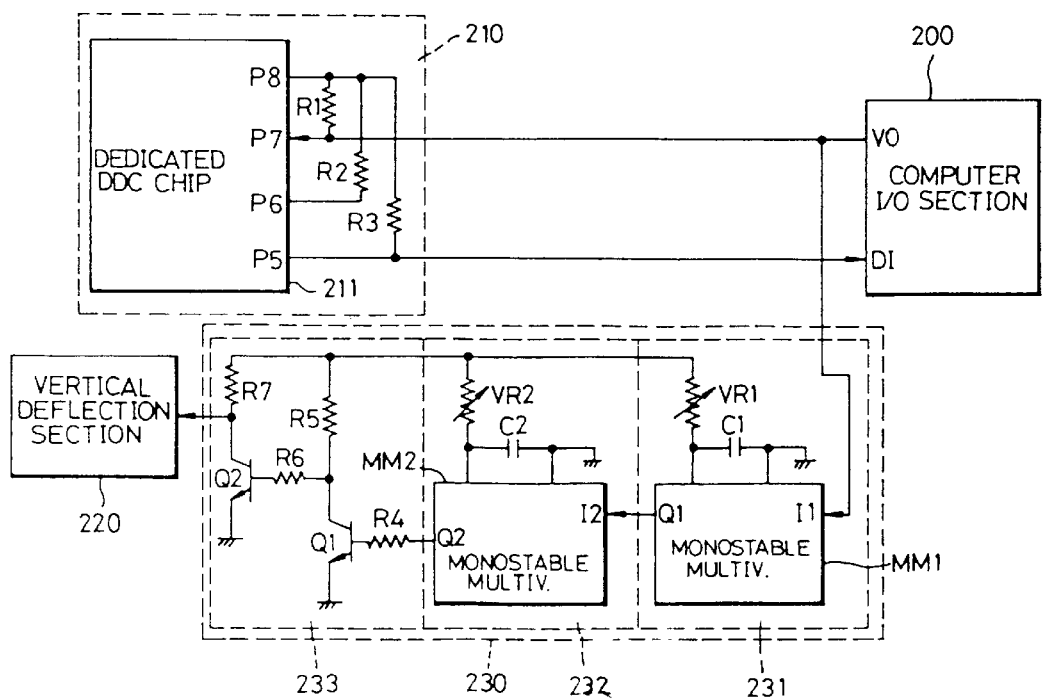
FIG. 4 is a schematic circuit diagram of an embodiment of the protection device according to the present invention.

The computer I/O section 200, DDC section 210, and vertical deflection section 220 in FIGS. 3 and 4 are same as those of the conventional device in construction and operation, respectively, and thus the detailed explanation of these sections will be omitted.

If a normal vertical sync signal having a frequency of 50 to 100 Hz as shown in FIG. 5A is outputted from the computer I/O section 200 as shown in FIG. 5A, the first monostable multivibrator MM1 in the vertical frequency selection control section 230 receives the normal vertical sync signal through its trigger input terminal I1. The first monostable multivibrator MM1 is triggered at a positive edge of the vertical sync signal, and then adjusts the pulse width of its output signal in accordance with the first time constant determined by a variable resistor VR1 and a capacitor C1 which are coupled to external input terminals of the first monostable multivibrator MM1 as shown in FIG. 5B.

The pulse-width-adjusted signal is then outputted from the output terminal Q1 of the first monostable multivibrator MM1. At this time, by properly adjusting the variable resistor VR1, the output signal of the first monostable multivibrator MM1 goes to a 'low' level before a following pulse of the vertical sync signal is inputted to the first monostable multivibrator MM1.

The second monostable multivibrator MM2 receives the output pulse signal of the first monostable multivibrator MM1 through its trigger input terminal I2 directly without gating as shown in FIG. 4, and adjusts the pulse width of its output signal in accordance with the second time constant determined by a variable resistor VR2 and a capacitor C2 which are coupled to external input terminals of the second monostable multivibrator MM2 as shown in FIG. 5C. At this time, by properly adjusting the variable resistor VR2, the pulse signal outputted from the output terminal Q2 of the second monostable multivibrator MM2 has a pulse width the same as that of the vertical sync signal provided from the computer I/O section 200.

The output pulse signal of the second monostable multivibrator MM2 is inputted to the base of a transistor Q1 in the switching section 233, and the transistor Q1 repeats an on/off operation to output through its collector an inverted pulse signal as shown in FIG. 5D. The inverted pulse signal is inputted to the base of a transistor Q2, and accordingly, the transistor Q2 outputs through its collector a pulse signal inverted once again as shown in FIG. 5E.

Consequently, the output pulse signal of the second monostable multivibrator MM2 is identical to the vertical sync signal provided from the computer I/O section 200, and is inputted to the vertical deflection section 220.

Meanwhile, if an abnormal vertical sync signal having a high frequency of about 25 KHz is outputted from the computer I/O section 200 to the input terminal I1 of the first monostable multivibrator MM1 in the vertical frequency selection control section 230 as shown in FIG. 6A, i.e., in the event that the monitor information data is transmitted from the DDC section 210 to the computer I/O section 200, the first monostable multivibrator MM1 is triggered at a positive edge of the vertical sync signal as shown in FIG. 6B, and then adjusts the pulse width of its output signal in accordance with the first time constant determined by the variable resistor VR1 and the capacitor C1.

At this time, considering the high frequency of the input vertical sync signal, the first time constant has been determined to be relatively large, and this causes the output signal through the output terminal Q1 of the first monostable multivibrator MM1 to be kept in a 'high' level as shown in FIG. 6B until following pulses of the vertical sync signal are inputted to the first monostable multivibrator MM1. Accordingly, the output signal of the first monostable multivibrator MM1 is kept in a 'high' level until the data transmission from the DDC section 210 is completed.

The second monostable multivibrator MM2 receives through its input terminal I2 the 'high' level signal outputted from the output terminal Q1 of the first monostable multivibrator MM1, and then adjusts the pulse width of its output signal in accordance with the second time constant determined by the variable resistor VR2 and the capacitor C2 as shown in FIG. 6C. The output signal of the second monostable multivibrator MM2 goes to a 'low' level after the second time constant period elapses, and such a 'low'-level state is maintained until the data transmission from the DDC section 210 is completed. The output signal of the second monostable multivibrator MM2 as described above is then inputted to the switching section 233.

The transistor Q1 in the second monostable multivibrator MM2 inverts the output signal of the second monostable multivibrator MM2 and outputs the inverted signal through its collector as shown in FIG. 6D. The inverted signal outputted from the transistor Q1 is inverted once again by the transistor Q2 as shown in FIG. 6E, and then inputted to the vertical deflection section 220.

Consequently, one pulse signal having a pulse width which corresponds to the second time constant determined by the variable resistor VR2 and the capacitor C2 in the second monostable multivibrator section 232 is inputted to the vertical deflection section 220 during the data transmission time of the DDC section 210.

From the foregoing, it will be apparent that protection device according to the present invention provides, the advantages that it can prevent the vertical deflection IC in the monitor from being damaged by intercepting the input of a high frequency signal of about 25 KHz to the vertical deflection IC when data is transmitted from the dedicated DDC chip to the computer. That is, the high frequency (abnormal vertical sync) signal is intercepted prior to reaching the vertical deflection IC, and thus is prevented from reaching the vertical deflection IC.

While the present invention has been described and illustrated herein with reference to the preferred embodiment thereof, it will be understood by those skilled in the art that various changes in form and details may be made therein without departing from the spirit and scope of the invention.

What is claimed is:

1. A circuit for providing on screen display information to a monitor while providing protection to a vertical deflection means within said monitor, the circuit comprising:
   display data channel (DDC) means for providing stored monitor information data;
   computer input/output (I/O) means providing a vertical sync signal to said DDC means and said vertical deflection means when power is supplied, and receiving monitor information data from said DDC means when a predetermined time elapses thereafter;
   said DDC means receiving said vertical sync signal provided from said computer I/O means, and providing said monitor information data to said computer I/O means at said predetermined time thereafter; and
   vertical frequency selection control means providing said vertical sync signal to said vertical deflection means if said vertical sync signal is received from said computer I/O means, and intercepting prior to reaching said vertical deflection means an abnormal vertical sync signal having a frequency higher than that of said vertical sync signal if said abnormal vertical sync signal is received from said computer I/O means, whereby said vertical deflection means is protected, said vertical selection control means comprising:
      a first monostable multivibrator receiving as a trigger input thereto said vertical sync signal, and providing a first pulse signal having a first pulse width determined by a first time constant;
      a second multivibrator receiving said first pulse signal directly without gating from said first monostable multivibrator, and providing a second pulse signal having a second pulse width determined by a second time constant; and
      switching means controlled according to said second pulse signal from said second monostable multivibrator, and providing said second pulse signal to said vertical deflection means.

2. A device for protecting a vertical deflection circuit for a monitor having a display data channel (DDC) circuit, the device comprising:
   a computer input/output (I/O) circuit providing a vertical sync signal to said DDC circuit and said vertical deflection circuit when power is supplied, and receiving monitor information data from said DDC circuit when a predetermined time elapses thereafter;
   said DDC circuit receiving said vertical sync signal provided from said computer I/O circuit, and providing said monitor information data to said computer I/O circuit at said predetermined time thereafter; and
   a vertical frequency selection control circuit providing said vertical sync signal to said vertical deflection circuit if said vertical sync signal is received from said computer I/O circuit, and intercepting prior to reaching said vertical deflection circuit an abnormal vertical sync signal having a frequency higher than that of said vertical sync signal if said abnormal vertical sync signal is received from said computer I/O circuit, said vertical frequency selection control circuit comprising:
      a first monostable multivibrator receiving as a trigger input thereto said vertical sync signal, and providing a first pulse signal having a first pulse width determined by a first time constant; and
      a second monostable multivibrator receiving as a trigger input thereto directly without gating said first pulse signal provided from said first monostable multivibrator, and providing a second pulse signal having a second pulse width determined by a second time constant as an input to said vertical deflection circuit.

3. The device as claimed in claim 2, wherein:
   said second time constant is adjusted such that said second pulse signal has a pulse width the same as that of said vertical sync signal.

4. The device as claimed in claim 2, wherein:
   said second pulse signal is input to said vertical deflection circuit without being gated by any other timing signals.

5. A circuit for providing on screen display information to a monitor while providing protection to a vertical deflection means within said monitor, the circuit comprising:
   display data channel (DDC) means for providing stored monitor information data;
   computer input/output (I/O) means providing a vertical sync signal to said DDC means and said vertical deflection means when power is supplied, and receiving monitor information data from said DDC means when a predetermined time elapses thereafter;
   said DDC means receiving said vertical sync signal provided from said computer I/O means, and providing said monitor information data to said computer I/O means at said predetermined time thereafter; and
   vertical frequency selection control means providing to said vertical deflection means:
      (a) if said vertical sync signal is received from said computer I/O means, said vertical sync signal; and
      (b) if an abnormal vertical sync signal is received from said computer I/O means, a single pulse having a pulse width equal to that of said vertical sync signal;
   whereby said vertical deflection means is protected;
   said vertical frequency selection control means comprising:
      a first monostable multivibrator receiving as a trigger input thereto said vertical sync signal, and providing a first pulse signal having a first pulse width determined by a first time constant;
      a second multivibrator receiving said first pulse signal directly without gating from said first monostable multivibrator, and providing a second pulse signal having a second pulse width determined by a second time constant; and switching means controlled according to said second pulse signal from said second monostable multivibrator, and providing said second pulse signal to said vertical deflection means.

* * * * *